United States Patent [19]
Kawasoe

[11] Patent Number: 5,905,617
[45] Date of Patent: May 18, 1999

[54] DIFFERENTIAL AMPLIFIER HAVING A PROTECTION CIRCUIT

[75] Inventor: Yujiro Kawasoe, Tokyo, Japan

[73] Assignees: Mitsubishi Denki Kabushiki Kaisha; Mitsubishi Electric Engineering Co., Ltd., both of Tokyo, Japan

[21] Appl. No.: 09/017,674

[22] Filed: Feb. 3, 1998

[30] Foreign Application Priority Data

Jul. 25, 1997 [JP] Japan ................................. 9-200058

[51] Int. Cl.$^6$ .................................................. H02H 3/18
[52] U.S. Cl. .............................. 361/86; 361/93; 361/56; 330/207 P
[58] Field of Search ...................... 361/79, 86–87, 361/56, 42, 58, 91, 93, 100–101, 111, 18; 330/298, 207 P; 323/274–276, 280, 284–285

[56] References Cited

U.S. PATENT DOCUMENTS

| | | | |
|---|---|---|---|
| 4,042,889 | 8/1977 | Baker | 330/207 P |
| 4,216,517 | 8/1980 | Takahashi | 361/79 |
| 4,440,980 | 4/1984 | Bakker | 379/395 |
| 4,644,288 | 2/1987 | Stanley | 330/2 |
| 4,714,898 | 12/1987 | Botti et al. | 330/298 |
| 5,383,083 | 1/1995 | Shinoda et al. | 361/103 |
| 5,650,652 | 7/1997 | Mizutani et al. | 257/355 |

FOREIGN PATENT DOCUMENTS

| | | |
|---|---|---|
| 55-71304 | 5/1980 | Japan . |
| 62-225013 | 10/1987 | Japan . |
| 62-284507 | 12/1987 | Japan . |

*Primary Examiner*—Ronald W. Leja
*Assistant Examiner*—Michael J. Sherry
*Attorney, Agent, or Firm*—Leydig, Viot & Mayer, Ltd.

[57] ABSTRACT

In a differential amplifier, when an output node of an output buffer circuit is short-circuited to a high potential supply node, the difference between the potential at an output node of an amplifying circuit and the potential at the output node of the buffer circuit becomes so great as not to be produced in normal operation. A short-circuit protection circuit detects such a state and interrupts or limits a base current supplied to an output transistor of an output pull signal generating circuit, suppressing the flow of excess current into the output node of the buffer circuit.

19 Claims, 4 Drawing Sheets

(PRIOR ART)

DIFFERENTIAL AMPLIFIER HAVING A PROTECTION CIRCUIT

BACKGROUND OF THE INVENTION

1. Field of the Invention

The present invention relates to a differential amplifier comprising an amplifying circuit for amplifying and outputting a difference voltage between a non-inverting input node and an inverting input node, and further comprises an output buffer circuit for outputting a signal based on the output of the amplifying circuit. More particularly, the present invention relates to a differential amplifier having a protection circuit that protects an output buffer circuit when its output node is short-circuited to a high potential supply node, a low potential supply node, or a low impedance portion, such as an output node or the like, of some other circuit.

2. Background Art

In any known differential amplifier having an amplifying circuit and an output buffer circuit, when an output node of a load-connected output buffer circuit is short-circuited to a high potential supply node, a low potential supply node, or a low impedance portion, such as an output node or the like, of some other circuit, there exists a danger that an excess current will flow in the output stage of the output buffer circuit.

Figure 5:
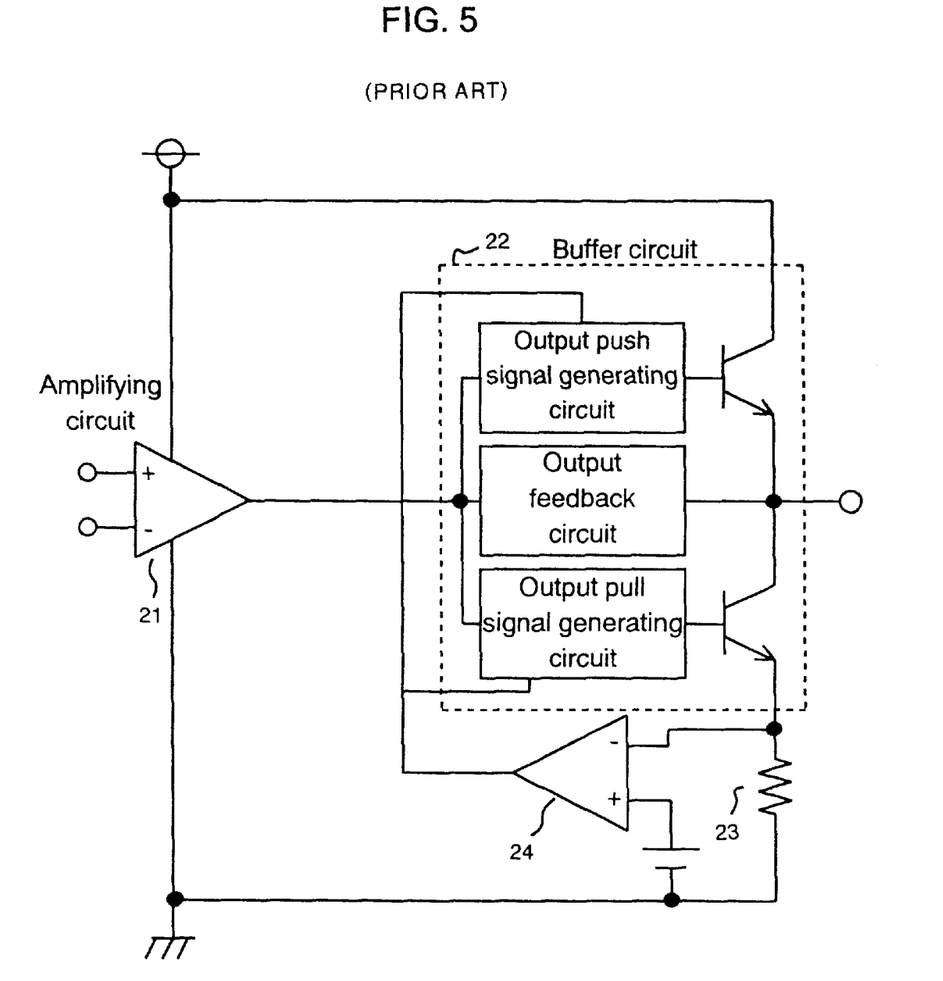
FIG. 5 shows an example of a differential amplifier incorporated a protection circuit.

In order to eliminate such a danger, an improved differential amplifier may be contrived, as shown in FIG. 5, for example, incorporating a protection circuit. In FIG. 5, there are included an amplifying circuit 21 driven by a supply voltage and amplifying a difference voltage between a non-inverting input node and an inverting input node; an output buffer circuit 22 driven by the same supply voltage as applied to the amplifying circuit 21; a sense resistor 23 for converting into a voltage the current flowing in the output stage of the buffer circuit 22; and a comparator 24 for comparing the voltage generated across the sense resistor 23 with a reference voltage and, in response to an increase in the voltage across the sense resistor 23 beyond the reference voltage, interrupting or limiting a base current supplied to a transistor or transistors constituting the output stage of the buffer circuit 22.

In such a protection circuit, the current flowing in the output-stage transistor of the output buffer circuit 22 is converted by the sense resistor 23 into a corresponding voltage and detected to determine whether the voltage is higher than a threshold voltage. If the voltage is higher than the threshold voltage, the current flowing in the output-stage transistor of the output buffer circuit 22 is interrupted or limited.

More specifically, when a short-circuit occurs between the output node of the output buffer circuit 22 and the high potential supply node, then a current flows from the high potential supply node, via the output node of the output buffer circuit 22, the output-stage transistor thereof, and the sense resistor 23, to the low potential supply node (GND). At this time, the voltage generated across the sense resistor 23 is determined by the current flowing in the sense resistor 23 and the sense resistance (=sense voltage).

If the sense voltage is higher than a threshold voltage (reference voltage), the comparator 24 interrupts or limits the base current supply (output pull signal generating circuit) to the output-stage transistor of the output buffer circuit 22, thereby preventing any excess current from flowing into the output of the buffer circuit 22.

However, when the current flowing into the output-stage transistor of the output buffer circuit 22 is reduced, the current flowing in the sense resistor 23 is also reduced and lowers the voltage generated across the sense resistor 23. Then, the comparator 24 halts interruption or limiting of the base current supply (i.e., an output pull signal generating circuit) to the output-stage transistor of the output buffer circuit 22, thereby allowing the current to flow again into the output-stage transistor of the output buffer circuit 22. This action is repeated during the short-circuited state.

Since the sense resistor 23 is connected in series to the output-stage transistor of the output buffer circuit 22, the dynamic range at the output node of the output buffer circuit 22 is narrowed by a value corresponding to the sense voltage generated across the sense resistor 23.

SUMMARY OF THE INVENTION

The present invention has been accomplished in view of the problems mentioned above. A first object of the invention resides in providing an improved differential amplifier which comprises an amplifying circuit and an output buffer circuit, wherein, when an output node of a load-connected output buffer circuit is short-circuited to a high potential supply node, a low potential supply node, or a low impedance portion, such as an output node or the like, of some other circuit, an excess current is prevented from flowing in the output stage of the output buffer circuit.

It is a second object of the invention to provide a differential amplifier wherein the output dynamic range in the output buffer circuit is not narrowed even by incorporating a protection circuit for suppressing any excess current flow in the output stage of the output buffer circuit upon occurrence of a short-circuit.

A third object of the invention is to provide a differential amplifier suppressing, upon occurrence of a short-circuit, any excess current flow in the output stage of the output buffer circuit even if supply voltages for driving the amplifying circuit and the output buffer circuit are different.

According to one aspect of the present invention, a differential amplifier comprises an amplifying circuit for amplifying and outputting a difference voltage applied between a non-inverting input node and an inverting input node of the amplifying circuit as an output signal. An output buffer circuit is provided for receiving the output of the amplifying circuit at an input node and delivering at an output node a signal based on the output of the amplifying circuit. Further, a protection circuit is provided for detecting the potential difference between the input node and the output node of the output buffer circuit. When the potential difference is greater than a threshold voltage, the protection circuit interrupts or limits the current flowing through the output buffer circuit.

In another aspect of the present invention, in the differential amplifier, the output buffer circuit comprises a first output transistor connected between a high potential supply node and the output node, and a second output transistor connected between the output node and a low potential supply node. An output push signal generating circuit is provided for feeding, to a control electrode of the first output transistor, a control current based on the output of the amplifying circuit at the input node. An output pull signal generating circuit is provided for feeding, to a control electrode of the second output transistor, a control current based on the output of the amplifying circuit at the input node. Further, the protection circuit has a low or ground fault protection circuit interrupting the control current flowing from the output push signal generating circuit of the output buffer circuit to the control electrode of the first output transistor when the potential difference is greater than the threshold voltage.

Alternatively, in another aspect of the present invention, in the differential amplifier, the protection circuit has a high or non-ground fault protection circuit that, when the potential difference is greater than the threshold voltage, interrupts the control current flowing from the output pull signal generating circuit of the output buffer circuit to the control electrode of the second output transistor.

Alternatively, in another aspect of the present invention, in the differential amplifier, the protection circuit comprises a low or ground fault protection circuit that, when the potential difference is greater than the threshold voltage, interrupts the control current flowing from the output push signal generating circuit of the output buffer circuit to the control electrode of the first output transistor; and a high or non-ground fault protection circuit that, when the potential difference is greater than the threshold voltage, interrupts the control current flowing from the output pull signal generating circuit of the output buffer circuit to the control electrode of the second output transistor.

In another aspect of the present invention, in the differential amplifier, the amplifying circuit is connected to a first high potential supply node and a first low potential supply node, and is driven by supply potential applied between the first high potential supply node and the first low potential supply node. The output buffer circuit comprises a first output transistor connected between a second high potential supply node and the output node. The output buffer circuit comprises a second output transistor connected between the output node and a second low potential supply node. An output push signal generating circuit is provided for feeding a control current, based on the output of the amplifying circuit at the input node, to the control electrode of the first output transistor. An output pull signal generating circuit is provided for feeding a control current, based on the output of the amplifying circuit at the input node, to the control electrode of the second output transistor.

In another aspect of the present invention, in the differential amplifier, a first supply potential applied to the first high potential supply node and a third supply potential applied to the second high potential supply node are different.

In another aspect of the present invention, in the differential amplifier, a second supply potential applied to the first low potential supply node and a fourth potential applied to the second low potential supply node are different.

In another aspect of the present invention, in the differential amplifier, a first clamp circuit is connected between the input node of the output buffer circuit and the second high potential supply node.

In another aspect of the present invention, in the differential amplifier, a second clamp circuit is connected between the input node of the output buffer circuit and the second low potential supply node.

Other and further objects, features, and advantages of the invention will appear more fully from the following description.

BEST MODE OF CARRYING OUT THE INVENTION

This invention is described in further detail by way of example with reference to the accompanying drawings.

Figure 1:
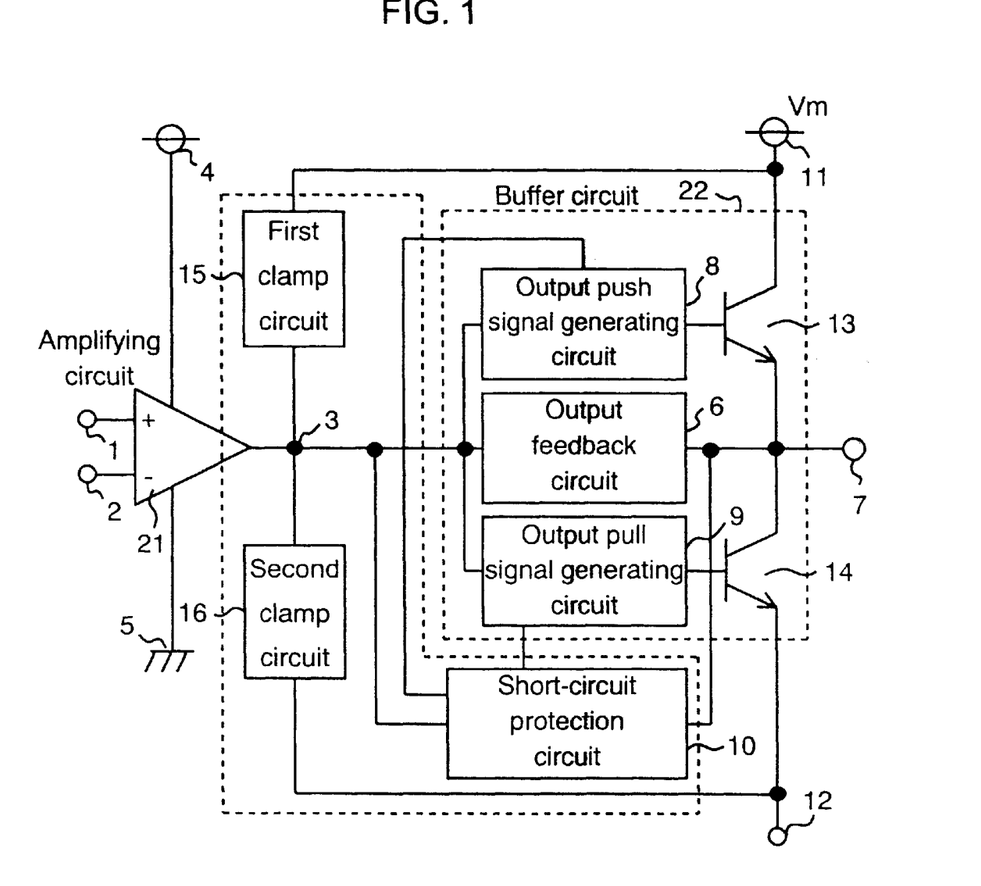
FIG. 1 shows a circuit construction of a differential amplifier according to the present invention.
Figure 2:
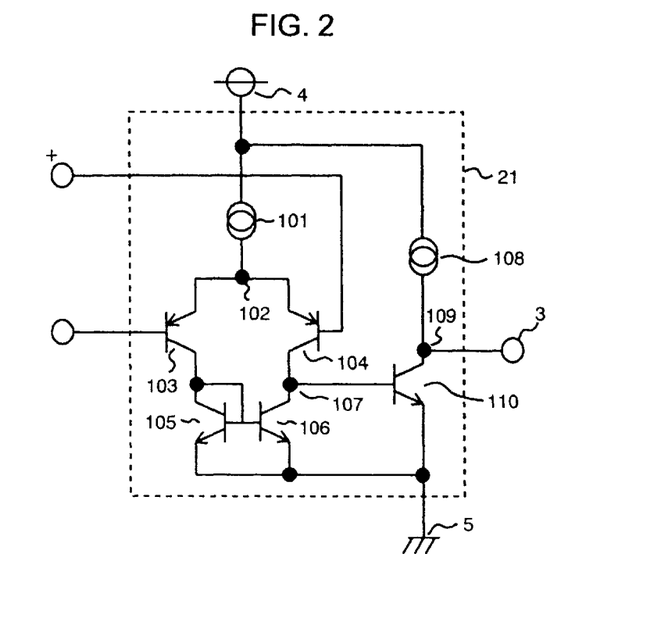
FIG. 2 shows an amplifying circuit included in the differential amplifier according to the present invention.
Figure 3:
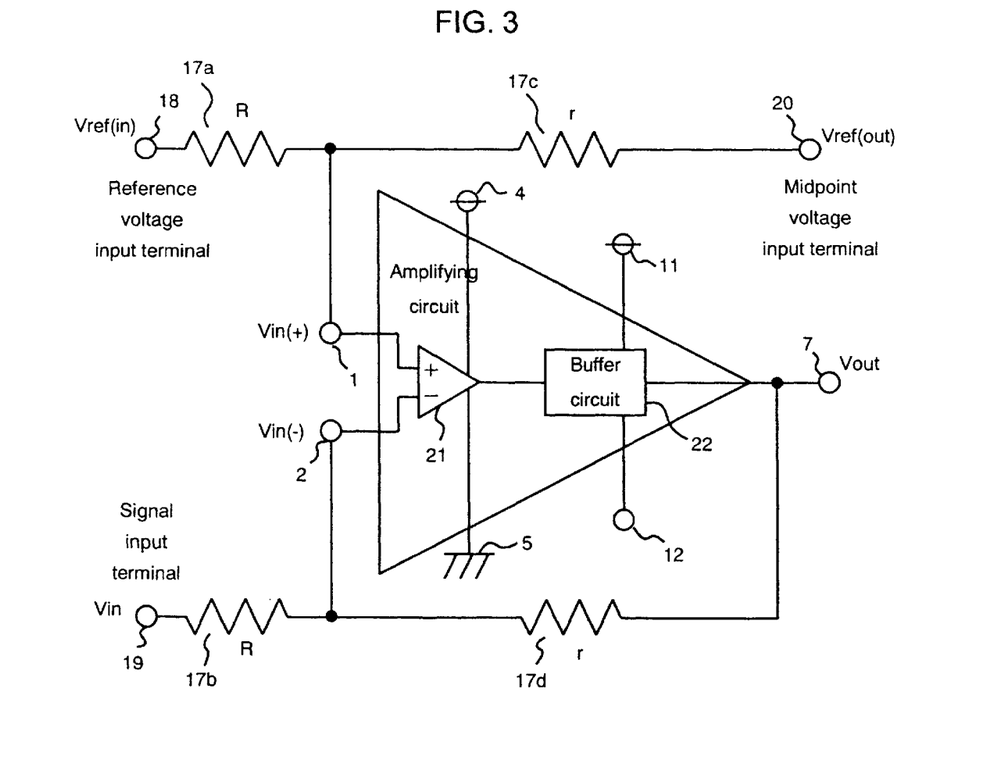
FIG. 3 shows a circuit construction of a differential amplifier according to the present invention.
Figure 4:
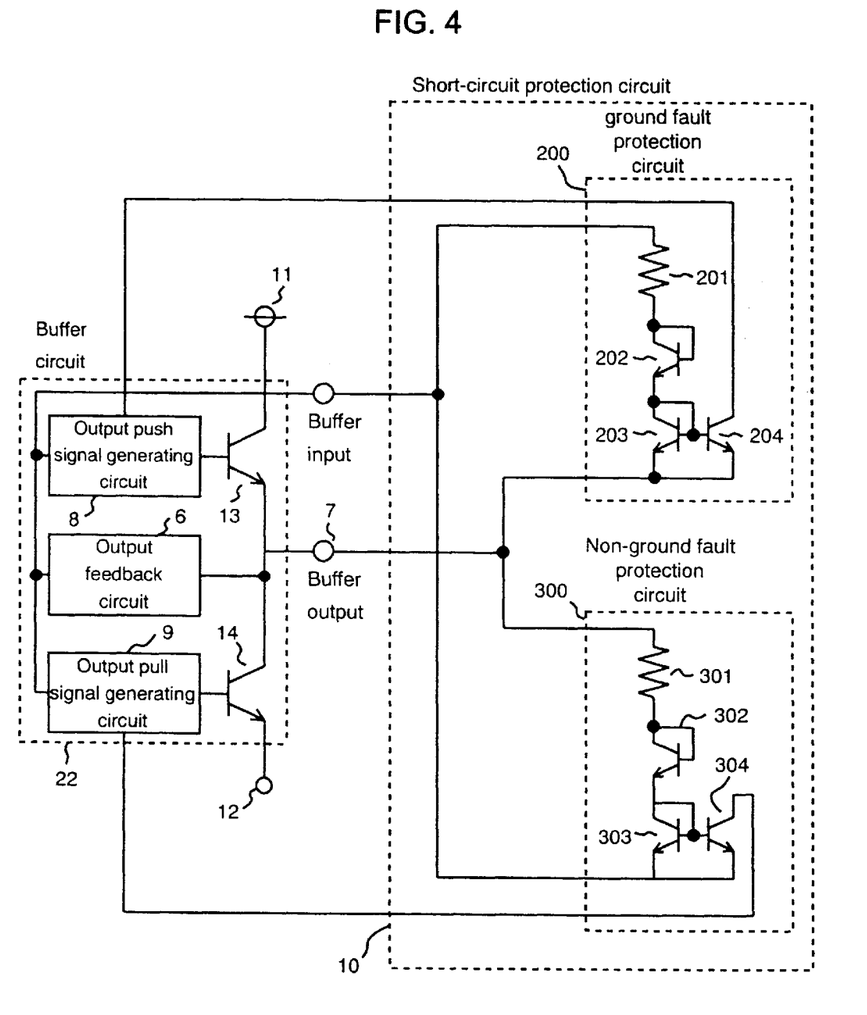
FIG. 4 shows a short-circuit protection circuit included in the differential amplifier according to the present invention.

FIGS. 1 to 4 represent a first embodiment of the present invention. FIG. 1 shows a differential amplifier without a feedback resistor; FIG. 2 shows an amplifying circuit 21 of FIG. 1; FIG. 3 shows a connection of the differential amplifier and feedback resistors; and FIG. 4 shows a short-circuit protection circuit 10 of FIG. 1.

In FIG. 1, there are shown a non-inverting input node 1 of a differential amplifying circuit 21, an inverting input node 2 of the amplifying circuit 21, an output node 3 of the amplifying circuit 21, and a first high potential supply node 4 for driving the amplifying circuit 21, wherein a first potential is applied to the node 4. In this first embodiment, the first potential is the higher one (e.g., 12V) of two different positive supply potentials applied to a semiconductor IC unit in which the differential amplifier of this invention is incorporated. Also shown in FIG. 1 is a first low potential supply node 5 for driving the amplifying circuit 21, wherein a second potential lower than the first potential is applied to the node 5. The second potential in this first embodiment is a ground potential (GND).

Reference numeral 6 denotes an output feedback circuit for transferring the output potential of the amplifying circuit 21 to an output buffer circuit 22. The feedback circuit 6 is driven by the supply potentials applied to the first high potential supply node 4 and the first low potential supply node 5, and serves to feed back a potential, based on the potential at an output node 7 of the output buffer circuit 22, to an input node of the buffer circuit 22 to stabilize the potential at the output node 7. A load is connected to the output node 7 of the output buffer circuit 22. Denoted by 8 is an output push signal generating circuit for feeding a control current to a first transistor 13 of an output stage as described later in detail. The circuit 8 is driven by the potentials applied to the first high potential supply node 4 and the first low potential supply node 5, and outputs a control current proportional to the potential at the input node of the output buffer circuit 22, to the first transistor 13.

Reference numeral 9 denotes an output pull signal generating circuit for feeding a control current to a second transistor 14 of an output stage as described later in detail. The circuit 9 is driven by the potentials applied to the first high potential supply node 4 and the first low potential supply node 5, and outputs to the second transistor 14 a control current proportional to the potential at the input node of the output buffer circuit 22 and has an inverted relationship with respect to the output signal from the output push signal generating circuit 8.

Denoted by reference numeral 10 is a short-circuit protection circuit that detects the difference between the potential at the input node of the output buffer circuit 22 and the potential at the output node 7 thereof, then makes a decision as to whether the detected potential difference is greater than a threshold voltage, i.e., whether the output node 7 of the output buffer circuit 22 is short-circuited. If the potential difference is greater than the threshold voltage, indicating a short-circuited state, the short-circuit protection circuit 10 interrupts or limits the current flowing in the output stage of the output buffer circuit 22. In this manner, the short-circuit protection circuit 10 interrupts or limits the base current supply to the transistor 13 or 14 of the output pull signal generating circuit 9.

Reference numeral 11 denotes a second high potential supply node for driving the transistors 13 and 14 of the output stage of the output buffer circuit 22. This node 11 is separate from the first high potential supply node 1, and a third supply potential is applied thereto. In this first embodiment, the third supply potential Vm is the higher (e.g., 12V) or the lower (e.g., 5V) of two different positive supply potentials (e.g., 5V, 12V). Denoted by 12 is a second low potential supply node for driving the transistors 13 and 14 constituting the output stage of the output buffer circuit 22. A fourth supply potential lower than the third supply potential is applied to this node 12. In the first embodiment, the fourth supply potential is the lower (e.g., 5V) of the two different positive supply potentials, or a ground potential.

Reference numeral 13 denotes a transistor (source-side output transistor) of an output stage of the output buffer circuit 22. This transistor 13 is an npn bipolar transistor with a base electrode (control electrode) receiving a control current from the output push signal generating circuit 8, and a collector electrode (one main electrode) connected to the second high potential supply node 11, and an emitter electrode (other main electrode) connected to the output node 7. Denoted by 14 is a transistor (sink-side output transistor) of the output stage of the output buffer circuit 22. This transistor 14 is an npn bipolar transistor with a base electrode (control electrode) receiving a control current from the output pull signal generating circuit 9, a collector electrode (one main electrode) connected to the output node 7, and an emitter electrode (other main electrode) connected to the second low potential supply node 12.

Reference numeral 15 denotes a first clamp circuit connected between the input node of the output buffer circuit 22 and the second high potential supply node 11. When there is any difference between the first supply potential applied to the first high potential supply node 4 and the third supply potential applied to the second high potential supply node 11, the first clamp circuit 15 limits the maximum output from the amplifying circuit 21, functioning as a partial protection circuit. In this first embodiment, the first clamp circuit 15 includes a diode element (including a diode-connected transistor) with an anode connected to the input node of the output buffer circuit 22 and a cathode connected to the second high potential supply node 11 and clamps the maximum potential at the input node of the output buffer circuit 22 to a voltage obtained by adding the forward voltage of the diode element to the third supply potential applied to the second high potential supply node 11.

Reference numeral 16 denotes a second clamp circuit connected between the input node of the output buffer circuit 22 and the second low supply potential node 12. When there is any difference between the second supply potential applied to the first low potential supply node 5 and the fourth supply potential applied to the second low potential supply node 12, the second clamp circuit 16 limits the minimum value of the output from the amplifying circuit 21, functioning as a partial protection circuit. In this first embodiment, the second clamp circuit 16 includes a diode element (including a diode-connected transistor) with an anode connected to the second low potential supply node 12 and a cathode connected to the input node of the output buffer circuit 22, and clamps the minimum potential at the input node of the output buffer circuit 22 to a voltage obtained by adding the forward voltage of the diode element to the fourth supply potential applied to the second low potential supply node 12.

A specific example of the amplifying circuit 21 of FIG. 1 is shown in FIG. 2, for example. In FIG. 2, there are included a first constant current source 101 which receives the first supply potential from the first high potential supply node 4 and feeds a constant current to a first common node 102; a pnp bipolar transistor 103 with an emitter electrode connected to the first common node 102 and a base electrode connected to the inverting input node 1; and a pnp bipolar transistor 104 with an emitter electrode connected to the first common node 102, a base electrode connected to the non-inverting input node 2, and a collector electrode connected to a first output node 107, respectively. The transistors 103 and 104 constitute a differential transistor pair.

There are also included an npn bipolar transistor 105 having base and collector electrodes connected to each other and also to the collector electrode of the transistor 103, and an emitter electrode connected to the first low potential supply node 2; and an npn bipolar transistor 106 with a base electrode connected to the base electrode of the transistor 105, a collector electrode connected to the collector electrode of the transistor 104, and an emitter electrode connected to the first low potential supply node 5, respectively. The transistors 105 and 106 are connected in a current mirror circuit.

The amplifying circuit of FIG. 2 also includes a second constant current source 108 which receives the first supply potential from the first high potential supply node 4 and feeds a constant current to a second output node 109; and an npn bipolar transistor 110 with a base electrode connected to the first output node 107, a collector electrode connected to the second output node 109, and an emitter electrode connected to the first low potential supply node 5, respectively.

A specific example of the short-circuit protection circuit 10 in FIG. 1 is shown in FIG. 4, for example. The circuit of FIG. 4 includes a load element 201 with a resistive element having one end connected to the input node of the output buffer circuit 22; a diode element 202 of an npn bipolar transistor with its collector electrode and base electrode connected in common to a second end of the load element 201; an npn bipolar transistor 203 with its collector electrode and base electrode connected in common to the emitter electrode of the transistor 202, and an emitter electrode connected to the output node 7 of the output buffer circuit 22; and an npn bipolar transistor 204 with its base electrode connected to the base electrode of the transistor 203, its emitter electrode connected to the emitter electrode of the transistor 203, and a collector electrode connected to the output push signal generating circuit 8, respectively. When the output node 7 of the output buffer circuit 22 is short-circuited to the second low potential supply node 12, the transistor 204 extracts the control current flowing from the output push signal generating circuit 8 into the control electrode of the transistor 13. The transistors 203 and 204 are connected in a current mirror circuit.

The load element 201 and the transistors 202 to 204 are included in a low or ground fault protection circuit 200 that interrupts the control current flowing from the output push signal generating circuit 8 of the output buffer circuit 22 into the control electrode of the first output transistor 13 when the potential difference detected between the input node and the output node 7 of the output buffer 22 is greater than a threshold voltage (i.e., in the first embodiment, twice the base-emitter voltage of the npn bipolar transistor).

The protection circuit of FIG. 4 includes a load element 301, a resistive element, having one end connected to the output node 7 of the output buffer circuit 22; a diode element 302 of a diode-connected npn bipolar transistor with its collector electrode and base electrode connected in common to a second end of the resistive element 301; an npn bipolar transistor 303 with its collector electrode and base electrode connected in common to the emitter electrode of the transistor 302, and an emitter electrode connected to the input node of the output buffer circuit 22; and an npn bipolar transistor 304 with a base electrode connected to the base electrode of the transistor 303, an emitter electrode connected to the emitter electrode of the transistor 303, and a collector electrode connected to the output pull signal generating circuit 9, respectively. When the output node 7 of the output buffer circuit 22 is short-circuited to the second high potential supply node 11, the transistor 304 extracts the control current flowing from the output pull signal generating circuit 9 into the control electrode of the transistor 14. The transistors 303 and 304 are connected in a current mirror circuit.

The load element 301 and the transistors 302 to 304 are included in a high or non-ground fault protection circuit 300 that interrupts the control current flowing from the output pull signal generating circuit 9 of the output buffer circuit 22 into the control electrode of the second output transistor 14 when the potential difference detected between the input node and the output node 7 of the output buffer 22 is greater than a threshold voltage (i.e., in the first embodiment, twice the base-emitter voltage of the npn bipolar transistor).

FIG. 3 shows a connection of the differential amplifier and feedback resistors. The circuit of FIG. 3 includes a first resistive element 17a connected between a first input terminal 18 and the non-inverting input node 1 of the amplifying circuit 21; and a second resistive element 17b connected between a second input terminal 19 and the inverting input node 2 of the amplifying circuit 21. In this first embodiment, the resistance value R of the first resistive element 17a and that of the second resistive element 17b are equal to each other. Further, in the first embodiment, a reference voltage is applied as a first input signal to the first input terminal 18, while a control signal is fed as a second input signal to the second terminal 19.

Reference numeral 17c denotes a third resistive element connected between the non-inverting input node 1 of the amplifying circuit 21 and the output reference potential node 20. In the first embodiment, the ratio (r/R) of resistance r of resistance element 17c to the resistance R of the first resistive element 17a is set within a range of 3 to 6. A fourth resistive element 19d is connected between the inverting input node 2 of the amplifying circuit 21 and the output node 7 of the output buffer circuit 22. In this first embodiment, the resistance r is equal to the resistance of the third resistive element 17c. Also in the first embodiment, the reference potential applied to the output reference potential node 20 is a midpoint voltage that determines the midpoint of the output produced at the output node 7 of the output buffer circuit 22.

The operation of the differential amplifier having such a circuit configuration is described below principally with regard to some exemplary cases where the output node 7 of the output buffer circuit 22 is short-circuited.

FIRST EXAMPLE

The output Vout produced at the output node 7 of the output buffer circuit 22 is determined, for feedback, according to Eq. (1).

$$(Vref[in] - Vin) \times (r/R) + Vref[out] \qquad (1)$$

In this equation, Vref[in] stands for a reference voltage applied as a first input signal to the first input terminal 18; Vin for a signal input voltage in a control signal fed as a second input signal to the second input terminal 19; and Vref[out] for a midpoint voltage applied as a reference voltage to the output reference potential node 20.

In the first embodiment, the voltage obtained at the output node 3 of the amplifying circuit 21, i.e., the voltage at the input node of the output buffer circuit 22, is substantially equal to the voltage at the output node 7 of the output buffer circuit 22. (To be exact, a potential having a fixed relationship to the output of the buffer circuit 22 is generated at the output terminal of the amplifying circuit 21 due to the configuration of the output buffer circuit 22.)

If the output node 7 of the output buffer circuit 22 is short-circuited to any node where a voltage higher than the output potential during feedback is applied, e.g., to the first or third high potential supply nodes 4 or 11, then the potential at the output node 7 of the output buffer circuit 22 is made equal to the potential in the short-circuited node. Consequently, an excess current flows from the short-circuited node into the output node 7 of the output buffer circuit 22. In this case, the potential Vin[−] at the inverting input terminal 2 is as expressed as Eq. (2).

$$Vin[-] = (Vout - Vin) \times R/(r+R) + Vin \qquad (2)$$

Thus, the potential Vin[−] obtained at the inverting input terminal 2 becomes higher than the potential Vin[+] at the non-inverting input terminal 1. In normal operation (during which the output node 7 of the buffer circuit 22 is not short-circuited), the potential Vin[−] at the inverting input terminal 2 and the potential Vin[+] at the non-inverting input terminal 1 are kept equal to each other.

Therefore, the amplifying circuit 21 performs a comparator operation so that the potential at the output node 3 of the amplifying circuit 21 is minimized within the dynamic range of the amplifying circuit 21. At this time, the output push signal generating circuit 8 applies a low (L) level potential to the base of the transistor 13 and turns off that transistor. Meanwhile the output pull signal generating circuit 9 applies a high (H) level potential, i.e., a control current, to the base of the transistor 13 and turns on the transistor 14.

However, the difference between the potential at the output node 3 of the amplifying circuit 21 and the potential at the output node 7 of the output buffer circuit 22 is so great as not to be produced in a normal state of operation. The short-circuit protection circuit 10 detects this state and then interrupts or limits the base current supplied to the sink-side output transistor 14 of the output pull signal generating circuit 9.

More specifically, as shown in FIG. 4, the potential at the output node 7 of the output buffer circuit 22 becomes higher than the potential at the input node of the output buffer circuit 22, i.e., higher than twice the base-emitter voltage of the npn bipolar transistor, so that a current flows from the output node 7 of the output buffer circuit 22 to the input node via the resistance element 301, the diode element 302, and the transistor 303.

Due to such a current flow in the transistor 303, a current flows in the transistor 304, the current mirror circuit in combination with the transistor 303, so that a control current flows from the output pull signal generating circuit 9 to the base electrode of the transistor 14 and into the transistor 304. As a result, no current flows into the transistor 14 so the transistor 14 is turned off.

Thus, it becomes possible to interrupt or limit the current flow into the output node 7 of the output buffer circuit 22. As long as this short-circuited condition continues, the relationship between the potential at the output node 7 of the output buffer circuit 22 and the input node of the buffer circuit 22 remains unchanged and maintains the state where the current flow into the output node 7 of the output buffer circuit 22 is interrupted or limited.

SECOND EXAMPLE

If the output node 7 of the output buffer circuit 22 is short-circuited to any node at a voltage lower than the output potential during feedback, e.g., to the second or fourth potential supply nodes 5 or 12 or to the ground potential node, then the potential at the output node 7 of the output buffer circuit 22 is made equal to the potential at the short-circuited node. Consequently, a current flows from the output node 7 of the output buffer circuit 22 to the short-circuited node. In this case, the potential Vin[−] obtained at the inverting input terminal 2 is expressed as Eq. (2).

Thus, the potential Vin[−] at the inverting input terminal 2, in this case, becomes lower than the potential Vin[+] at the non-inverting input terminal 1. In normal operation (during which the output node 7 of the buffer circuit 22 is not short-circuited), the potential Vin[−] at the inverting input terminal 2 and the potential Vin[+] at the non-inverting input terminal 1 are kept equal to each other.

Therefore, the amplifying circuit 21 performs a comparator operation so that the potential at the output node 3 of the amplifying circuit 21 is maximized within the dynamic range of the amplifying circuit 21. At this time, the output push signal generating circuit 8 applies a high (H) level potential, i.e., a control current, to the base of the transistor 13 and turns on the transistor 13. Meanwhile the output pull signal generating circuit 9 applies a low (L) level potential to the base of the transistor 14 and turns off the transistor 14.

However, the difference between the potential at the output node 3 of the amplifying circuit 21 and the potential at the output node 7 of the output buffer circuit 22 is so great as not to be produced in a normal state of operation. The short-circuit protection circuit 10 detects this state and then interrupts or limits the base current supplied to the source-side output transistor 13 of the output push signal generating circuit 8.

More specifically, as shown in FIG. 4, the potential at the input node of the output buffer circuit 22 becomes higher than the potential at the output node 7 of the output buffer circuit 22, i.e., higher than twice the base-emitter voltage of the npn bipolar transistor, so that a current flows from the input node of the output buffer circuit 22 to the output node 7 via the resistance element 201, the diode element 202, and the transistor 203.

Due to such a current flow in the transistor 203, a current flows in the transistor 204 which, in combination with the transistor 203, is a current mirror circuit so that a control current flowing from the output push signal generating circuit 8 to the base electrode of the transistor 13 flows into the transistor 204. As a result, no current flows into the transistor 13 and the transistor 13 is turned off.

Thus, it becomes possible to interrupt or limit the outflow of current from the output node 7 of the output buffer circuit 22. As long as this short-circuited condition continues, the relationship between the potential at the output node 7 of the output buffer circuit 22 and the input node of the output buffer circuit 22 remains unchanged and interruption or limitation of the outflow current from the output node 7 of the output buffer circuit 22 is maintained.

THIRD EXAMPLE

In the foregoing explanation, the first example represents a case where the output node 7 of the output buffer circuit 22 is short-circuited to the first or second high potential supply node 4 or 11, and the second example represents another case where the output node 7 is shorted to the first or second low potential supply node 5 or 12. However, it is to be understood that the present invention is not limited to these examples. Also, where the output node 7 is short-circuited to a low-impedance output node or the like of some other circuit, a potential difference greater than the value in normal operation appears between the input node of the output buffer circuit 22 and the output node 7 thereof. Then, the same action as in the first and second examples is executed, interrupting or limiting inflow or outflow of any excess current into or from the output node 7 of the output buffer circuit 22.

FOURTH EXAMPLE

When any excess current over the output current capacity of the output buffer circuit 22 flows into or flows out of the output node 7 of the output buffer circuit 22 for some reason, and the potential produced at the output node 7 of the output buffer circuit 22 is determined merely by the characteristics of the base current and the collector current of the output-stage transistor 13 or 14 of the output buffer circuit 22, rather than by the potential determined by the essential feedback in the differential amplifier, a potential greater than the potential difference in normal operation appears between the input node of the output buffer circuit 22 and the output node 7 of the output buffer circuit. Thus, the same action as in the first and second examples interrupts or limits inflow or outflow of the excess current to or from the output node 7 of the output buffer circuit 22.

Next, an explanation will be given of the function of the first and second clamp circuits 15 and 16 incorporated in the differential amplifier of the circuit configuration described above.

In the differential amplifier having such a configuration, the first high and low supply potential nodes 4 and 5 for driving the amplifying circuit 21 and the second high and low supply potential nodes 11 and 12 for driving the output-stage transistors 13 and 14 of the output buffer circuit 22 are provided as separate nodes. Consequently, it is possible to apply individual potentials from different power supplies to these separate nodes. For example, in a semiconductor IC unit in which this differential amplifier is incorporated, two different positive supply potentials, 12V and 5V, are used, so that the following four cases are possible in applying the potentials.

In a first case, 12V is applied to both the first and second high supply potential nodes 4, 11, while the first and second low supply potential nodes 5 and 12 are both grounded.

In a second case, 12V is applied to the first high potential supply node 4, while the first low potential supply node 5 is grounded, and 12V is applied to the second high potential supply node 11, while 5V is applied to the second low supply potential node 12.

In a third case, 12V is applied to the first high potential supply node 4 while the first low potential supply node 5 is grounded, and 5V is applied to the second high potential supply node 11 while the second low potential supply node 12 is grounded.

In a fourth case, 5V is applied to both the first and second high potential supply nodes 4 and 11, while first and second low supply potential nodes 5 and 12 are both grounded.

In the first and fourth cases, the output dynamic range of the amplifying circuit 21 and that of the output stage of the buffer circuit 22 are substantially equal to each other, whereby the same operation is performed without provision of the first and second clamp circuits 15 and 16. In these cases, therefore, the first and second clamp circuits 15 and 16 do not function substantially.

Meanwhile in the second and third cases, the output dynamic range of the amplifying circuit 21 is wider than that of the output stage of the buffer circuit 22. Therefore, the first and second clamp circuits 15 and 16 enable proper operation of the short-circuit protection circuit 10.

Now the second case will be explained as one example. When the input condition is set so that the potential at the output node 3 of the amplifying circuit 21 is minimized within the dynamic range of this circuit 21, then the potential at the output node 7 of the output buffer circuit 22 is also minimized within the dynamic range of the buffer circuit 22. If the second clamp circuit 16 is not present, the difference between the potential at the output node 3 of the amplifying circuit 21 and the potential at the output node 7 of the buffer circuit 22 becomes approximately 5V (=5V–0V). Then, the short-circuit protection circuit 10 determines that the output node 7 of the buffer circuit 22 is in a short-circuited state.

However, in the first embodiment where the second clamp circuit 16 is connected between the output node 3 of the amplifying circuit 21 and the second low supply potential node 12, the potential at the output node 3 of the amplifying circuit 21 is clamped to a potential based on the fourth supply potential (5V in this case) applied to the second low potential supply node 12, i.e., in the first embodiment, to a voltage higher by the base-emitter voltage of the transistor of the second clamp circuit 16.

Therefore, in normal operation, the potential difference between the input node of the output buffer circuit 22 and the output node 7 of the output buffer circuit is suppressed, in the first embodiment, to lower than the base-emitter voltage of the transistor of the second clamp circuit 16. Consequently, the protection circuit 10 does not function during normal operation.

Next, the third case will be explained below as another example. When the input condition is set so that the potential obtained at the output node 3 of the amplifying circuit 21 is maximized within the dynamic range of this circuit 21, the potential at the output node 7 of the output buffer circuit 22 is also maximized within the dynamic range of the buffer circuit 22. If the first clamp circuit 15 is not present, the difference between the potential at the output node 3 of the amplifying circuit 21 and the potential at the output node 7 of the buffer circuit 22 becomes approximately 7V (=12V–5V). Then the short-circuit protection circuit 10 indicates that the output node 7 of the buffer circuit 22 is in a short-circuited state.

However, in the first embodiment where the first clamp circuit 15 is connected between the amplifying circuit 21 and the second high potential supply node 11, the potential at the output node 3 of the amplifying circuit 21 is clamped to a potential based on the third supply potential (5V in this case) applied to the second high supply potential node 11, i.e., in the first embodiment, to a voltage higher by the base-emitter voltage of the transistor constituting the first clamp circuit 15.

Therefore, in normal operation, the potential difference between the input node of the output buffer circuit 22 and the output node 7 of the output buffer circuit is suppressed, in the first embodiment, to be lower than the base-emitter voltage of the transistor constituting the first clamp circuit 15. Consequently, the protection circuit 10 does not function during normal operation.

Thus, in the differential amplifier of the circuit configuration described above, the following advantageous effects are achievable.

First, when the output node 7 of the output buffer circuit 22 is short-circuited, the flow of any excess current into or from the output node 7 of the buffer circuit 22 is suppressed.

Second, such suppression of the flow of excess current can be achieved without narrowing the dynamic range of the output stage of the buffer circuit 22.

Third, different supply potentials can be applied separately to the first high and low potential supply nodes 4 and 5 for driving the amplifying circuit 21, and to the second high and low potential supply nodes 11 and 12 for driving the output-stage transistors 13 and 14 of the buffer circuit 22.

Fourth, the protection circuit 10 functions properly even when different supply potentials are applied separately to the first and second high potential supply nodes 4 and 11, or to the first and second low potential supply nodes 5 and 12.

Obviously many modifications and variations of the present invention are possible in the light of the above teachings. It is therefore to be understood that, within the scope of the appended claims, the invention may by practiced otherwise than as specifically described.

What is claimed is:

1. A differential amplifier comprising:

an amplifying circuit for amplifying and outputting a difference between voltages applied between a non-inverting input node and an inverting input node of the amplifying circuit as an output signal;

an output buffer circuit receiving the output signal of said amplifying circuit at an input node and delivering at an output node a signal based on the output signal of said amplifying circuit; and a protection circuit for detecting the potential difference between the input node and the output node of said output buffer circuit and, when the potential difference is greater than a threshold voltage, indicating that said output buffer circuit is short-circuited, interrupting or limiting current flowing through said output buffer circuit as long as said output buffer circuit is short-circuited.

2. A differential amplifier comprising:

an amplifying circuit for amplifying and outputting a difference between voltages applied between a non-inverting input node and an inverting input node of said amplifying circuit as an output signal;

an output buffer circuit receiving the output signal of said amplifying circuit at an input node and delivering at an output node a signal based on the output signal of said amplifying circuit, said output buffer circuit including:

a first output transistor connected between a first high potential supply node and the output node;

a second output transistor connected between the output node and a first low potential supply node;

an output push signal generating circuit for feeding, to a control electrode of said first output transistor, a control current based on the output signal of said amplifying circuit at the input node; and an output pull signal generating circuit for feeding, to a control electrode of said second output transistor, a control current based on the output signal of said amplifying circuit at the input node; and a protection circuit for detecting the potential difference between the input node and the output node of said output buffer circuit and, when the potential difference is greater than a threshold voltage, interrupting or limiting current flowing through said output buffer circuit, said protection circuit having a low or ground fault protection circuit interrupting the control current flowing from said output push signal generating circuit of said output buffer circuit to the control electrode of said first output transistor when the potential difference is greater than the threshold voltage.

3. The differential amplifier according to claim 2, wherein said amplifying circuit is connected to a second high potential supply node and a second low potential supply node, and is driven by a first supply potential applied between the second high potential supply node and the second low potential supply node.

4. The differential amplifier according to claim 3, wherein a second supply potential applied to the second high potential supply node and a third supply potential applied to the first high potential supply node are different.

5. The differential amplifier according to claim 3, wherein a second supply potential applied to the second low potential supply node and a third supply potential applied to the first low potential supply node are different.

6. The differential amplifier according to claim 3, including a clamp circuit connected between the input node of said output buffer circuit and the first high potential supply node.

7. The differential amplifier according to claim 3, including a clamp circuit connected between the input node of said output buffer circuit and the first low potential supply node.

8. A differential amplifier comprising:
an amplifying circuit for amplifying and outputting a difference between voltages applied between a non-inverting input node and an inverting input node of said amplifying circuit as an output signal;
an output buffer circuit receiving the output signal of said amplifying circuit at an input node and delivering at an output node a signal based on the output signal of said amplifying circuit, said output buffer circuit including:
a first output transistor connected between a first high potential supply node and the output node;
a second output transistor connected between the output node and a first low potential supply node;
an output push signal generating circuit for feeding, to a control electrode of said first output transistor, a control current based on the output signal of said amplifying circuit at the input node; and
an output pull signal generating circuit for feeding, to a control electrode of said second output transistor, a control current based on the output signal of said amplifying circuit at the input node; and
a protection circuit for detecting the potential difference between the input node and the output node of said output buffer circuit and, when the potential difference is greater than a threshold voltage, interrupting or limiting current flowing through said output buffer circuit, said protection circuit having a high or non-ground fault protection circuit interrupting the control current flowing from said output pull signal generating circuit of said output buffer circuit to the control electrode of said second output transistor when the potential difference is greater than the threshold voltage.

9. The differential amplifier according to claim 8, wherein said amplifying circuit is connected to a second high potential supply node and a second low potential supply node, and is driven by a first supply potential applied between the second high potential supply node and the second low potential supply node.

10. The differential amplifier according to claim 9, wherein a second supply potential applied to the second high potential supply node and a third supply potential applied to the first high potential supply node are different.

11. The differential amplifier according to claim 9, wherein a second supply potential applied to the second low potential supply node and a third supply potential applied to the first low potential supply node are different.

12. The differential amplifier according to claim 9, including a clamp circuit connected between the input node of said output buffer circuit and the first high potential supply node.

13. The differential amplifier according to claim 9, including a clamp circuit connected between the input node of said output buffer circuit and the first low potential supply node.

14. A differential amplifier comprising:
an amplifying circuit for amplifying and outputting a difference between voltages applied between a non-inverting input node and an inverting input node of said amplifying circuit as an output signal;
an output buffer circuit receiving the output signal of said amplifying circuit at an input node and delivering at an output node a signal based on the output signal of said amplifying circuit, said output buffer circuit including:
a first output transistor connected between a first high potential supply node and the output node;
a second output transistor connected between the output node and a first low potential supply node;
an output push signal generating circuit for feeding, to a control electrode of said first output transistor, a control current based on the output signal of said amplifying circuit at the input node; and
an output pull signal generating circuit for feeding, to a control electrode of said second output transistor, a control current based on the output signal of said amplifying circuit at the input node; and
a protection circuit for detecting the potential difference between the input node and the output node of said output buffer circuit and, when the potential difference is greater than a threshold voltage, interrupting or limiting current flowing through said output buffer circuit, said protection circuit comprising a low or ground fault protection circuit interrupting the control current flowing from said output push signal generating circuit of said output buffer circuit to the control electrode of said first output transistor when the potential difference is greater than the threshold voltage and a high or non-ground fault protection circuit interrupting the control current flowing from said output pull signal generating circuit of said output buffer circuit to the control electrode of said second output transistor when the potential difference is greater than the threshold voltage.

15. The differential amplifier according to claim 14, wherein said amplifying circuit is connected to a second high potential supply node and a second low potential supply node, and is driven by a first supply potential applied between the second high potential supply node and the second low potential supply node.

16. The differential amplifier according to claim 15, wherein a second supply potential applied to the second high potential supply node and a third supply potential applied to the first high potential supply node are different.

17. The differential amplifier according to claim 15, wherein a second supply potential applied to the second low potential supply node and a third supply potential applied to the first low potential supply node are different.

18. The differential amplifier according to claim 15, including a clamp circuit connected between the input node of said output buffer circuit and the first high potential supply node.

19. The differential amplifier according to claim 15, including a clamp circuit connected between the input node of said output buffer circuit and the first low potential supply node.

* * * * *